United States Patent
Shibuya

(10) Patent No.: US 7,512,921 B2
(45) Date of Patent: Mar. 31, 2009

(54) METHOD AND APPARATUS FOR DESIGNING INTEGRATED CIRCUIT ENABLING THE YIELD OF INTEGRATED CIRCUIT TO BE IMPROVED BY CONSIDERING RANDOM ERRORS

(75) Inventor: Toshiyuki Shibuya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 468 days.

(21) Appl. No.: 11/019,365

(22) Filed: Dec. 23, 2004

(65) Prior Publication Data
US 2005/0108669 A1 May 19, 2005

Related U.S. Application Data

(63) Continuation of application No. PCT/JP02/10522, filed on Oct. 10, 2002.

(51) Int. Cl.
G06F 17/50 (2006.01)
(52) U.S. Cl. .................. 716/9; 716/1; 716/2; 716/8; 716/10; 716/14
(58) Field of Classification Search .......... 716/1, 716/2, 7–10, 13; 703/14
See application file for complete search history.

(56) References Cited

U.S. PATENT DOCUMENTS

| | | | | |
|---|---|---|---|---|
| 5,218,551 A * | 6/1993 | Agrawal et al. | ............... | 716/10 |
| 5,404,312 A | 4/1995 | Tawada | | |
| 5,781,446 A * | 7/1998 | Wu | ................ | 716/9 |
| 5,838,583 A * | 11/1998 | Varadarajan et al. | ........... | 716/9 |
| 6,026,225 A * | 2/2000 | Iwasaki | ........................ | 716/10 |
| 6,080,201 A * | 6/2000 | Hojat et al. | ..................... | 703/14 |
| 6,230,304 B1 * | 5/2001 | Groeneveld et al. | ............. | 716/7 |
| 6,317,859 B1 * | 11/2001 | Papadopoulou | ................ | 716/4 |
| 6,397,169 B1 * | 5/2002 | Shenoy et al. | .................. | 703/14 |
| 6,415,426 B1 * | 7/2002 | Chang et al. | .................... | 716/9 |
| 6,668,365 B2 * | 12/2003 | Harn | .......................... | 716/10 |
| 6,671,859 B1 * | 12/2003 | Naylor et al. | ................... | 716/2 |
| 6,757,878 B2 * | 6/2004 | Srinivasan et al. | ............. | 716/10 |
| 6,766,500 B1 * | 7/2004 | Donelly et al. | ................. | 716/10 |
| 7,024,642 B2 * | 4/2006 | Hess et al. | ....................... | 716/4 |
| 7,036,103 B2 * | 4/2006 | Miller et al. | .................... | 716/9 |
| 7,225,116 B2 * | 5/2007 | Harn | .......................... | 703/14 |
| 2002/0062465 A1 | 5/2002 | Goto | | |
| 2004/0221253 A1 * | 11/2004 | Imper et al. | .................... | 716/13 |
| 2005/0108669 A1 * | 5/2005 | Shibuya | .......................... | 716/9 |
| 2005/0251771 A1 * | 11/2005 | Robles | .......................... | 716/5 |
| 2006/0095872 A1 * | 5/2006 | McElvain et al. | ............... | 716/1 |

FOREIGN PATENT DOCUMENTS

| | | |
|---|---|---|
| JP | 3-188649 | 8/1991 |
| JP | 9-81623 | 3/1997 |
| JP | 11-85719 | 3/1999 |
| JP | 2001-127163 | 5/2001 |
| JP | 2001-344301 | 12/2001 |

* cited by examiner

*Primary Examiner*—Helen Rossoshek
(74) *Attorney, Agent, or Firm*—Staas & Halsey LLP

(57) ABSTRACT

A layout method in a layout apparatus for layout of an integrated circuit includes placing a plurality of cells at approximate positions according to the circuit data and placing the plurality of cells at specific positions according to the result of the placement of the plurality of cells at the approximate positions. In the placing the plurality of cells at specific positions, the plurality of cells are placed at specific positions, critical area values between cells adjacent to one another are calculated, and the specific positions of the cells are modified so as to reduce the critical area values obtained.

9 Claims, 14 Drawing Sheets

$$AC = r_0^2 L \left( \frac{2}{a_3 - b_1} - \frac{1}{2a_3 - b_1 - a_2} - \frac{1}{a_3 + b_2 - 2b_1} \right)$$

FIG. 17A

| CELL NAME | INV#1 | INV#2 | NAND | ... |
|---|---|---|---|---|
| INV#1 | 1 | 2 | 3 | |
| INV#2 | 4 | 2 | 3 | |
| NAND | 2 | 1 | 1 | |
| ⋮ | | | | |

| CELL NAME | INV#1 (N) | INV#2 (N) | NAND (N) | INV#1 (R) | INV#2 (R) | NAND (R) | ... |
|---|---|---|---|---|---|---|---|
| INV#1 (N) | 1 | 2 | 3 | 1 | 2 | 3 | |
| INV#2 (N) | 3 | 2 | 3 | 2 | 2 | 3 | |
| NAND (N) | 2 | 3 | 1 | 1 | 3 | 1 | |
| INV#1 (R) | 2 | 2 | 3 | 1 | 2 | 3 | |
| INV#2 (R) | 5 | 2 | 3 | 4 | 2 | 3 | |
| NAND (R) | 2 | 1 | 1 | 1 | 1 | 1 | |
| | | | | | | | |

42

METHOD AND APPARATUS FOR DESIGNING INTEGRATED CIRCUIT ENABLING THE YIELD OF INTEGRATED CIRCUIT TO BE IMPROVED BY CONSIDERING RANDOM ERRORS

CROSS-REFERENCE TO RELATED APPLICATIONS

This is a continuation application of PCT/JP02/10522 filed on Oct. 10, 2002 in Japan the contents of which are incorporated herein.

BACKGROUND OF THE INVENTION

1. Field of the Invention

This invention relates to a layout method, a layout apparatus, a layout program and a recording medium thereof, and more particularly to a layout method and a layout apparatus which enable the yield of LSIs to be improved by considering random errors in layout design, as well as a layout program and a recording medium thereof.

2. Description of the Related Art

As manufacturing processes of LSIs (semiconductor integrated circuit devices) have become finer, a decrease in the yield of LSIs caused by random errors has become a more serious problem. The random error results from "small contaminants (defects)" in a manufacturing process and shorts or opens wiring on a chip. The random error and system errors attributed to a defect in a manufacturing process are two major factors reducing the yield of LSIs manufactured.

In the conventional placement of cells and wires (layout design), the layout (or its optimization) is carried out on the basis of elements (hereinafter referred to as a cost) such as a wiring rate, timing, and crosstalk noise. The wiring rate is the rate of wiring completed by CAD. The timing is timings for the propagation of signals which are determined in view of a delay in propagation from element to element mainly dominated by a wiring length. Crosstalk noise is the effect of the capacitive coupling between the adjacent wires on their respective signal levels.

Thus, the layout design of LSIs or its optimization has not been carried out taking the random error as the cost of the layout design into consideration. As a result, even with layouts having exactly the same netlist for LSIs of the same circuit configuration, the yield of LSIs manufactured using the layouts may vary by at least 5%.

The random error is not considered in the layout design because it is caused by defects, so that where and how a random error occurs on a chip cannot be predicted. Thus, the random error in the layout design is not considered. Accordingly, even if an attempt is made to consider the random error, it has not been examined what index is used to reflect the random error in the layout design or how the index is reflected in the layout.

SUMMARY OF THE INVENTION

It is an object of the present invention to provide a layout method that enables the yield of LSIs to be improved by considering random errors in a layout design.

It is another object of the present invention to provide a layout apparatus that enables the yield of LSIs to be improved by considering random errors in a layout design.

It is yet another object of the present invention to provide a layout program that enables the yield of LSIs to be improved by considering random errors in a layout design.

It is still another object of the present invention to provide a layout program recording medium that enables the yield of LSIs to be improved by considering random errors in a layout design.

The present invention provides a layout method for a layout apparatus for laying out an integrated circuit. The method comprises placing a plurality of cells at approximate positions according to circuit data, and placing the plurality of cells at specific positions according to a result of the placing of the plurality of cells at the approximate positions. The placing of the plurality of cells at the specific positions further comprises placing the plurality of cells at the specific positions, determining critical area values between cells of the plurality of cells adjacent to one another, and modifying the specific positions of the plurality of cells so as to reduce the critical area values determined.

According to the layout method of the present invention, the critical area value is used as a parameter having a correlation with the occurrence of random errors. On the basis of the critical area value, the cells shown in circuit data are placed at the specific position. Thus, the random error, for which where or how it occurs on a chip cannot be predicted, can be considered in the placing of the cells in the layout design of an LSI. It is thus possible to provide an optimum layout design for the placing of cells while considering the random error (that is, the critical area value) as a cost in addition to a cost such as a wiring rate. As a result, the yield of LSIs can be intentionally improved, thus greatly contributing to semiconductor business. As manufacturing processes of LSIs have become finer, the yield depends more heavily on defects, that is, the random error. Accordingly, a reduction in random error based on the layout design is very effective.

Preferably, the layout method of the present invention further comprises placing wires between the plurality of cells at approximate positions according to the circuit data and the result of the placing of the plurality of cells at the specific positions, and placing the wires at specific positions according to a result of the placing of the wires at the approximate positions. The placing of the wires at the specific positions further comprises placing the wires at the specific positions, mathematically determining critical area values between the adjacent wires, and inserting the free space between the adjacent wires in a case that the critical area value determined is larger than a predetermined value and that a wiring free space is present near the position.

With the layout method configured in this manner, the wires shown in the circuit data are placed at the specific positions on the basis of the critical area values. Thus, an optimum layout design can be provided for the placing of the wires by considering the wiring rate and the like as well as the random error (that is, the critical area value) in the placing of the wires in the layout design of LSIs. As a result, the yield of LSIs can be intentionally improved. It is possible to reduce the random error on the basis of the random design.

The present invention provides a layout apparatus for laying out an integrated circuit, the apparatus comprises global placement means for placing a plurality of cells at approximate positions according to circuit data, and detail placement means for placing the plurality of cells at specific positions according to a result of the placement of the plurality of cells at the approximate positions. The detail placement means places the plurality of cells at the specific positions, and determines critical area values between cells of the plurality of cells adjacent to one another, and modifies the specific positions of the plurality of cells so as to reduce the critical area values determined.

According to the layout apparatus, the cells shown in circuit data are placed at the specific position on the bases of the critical area value as previously described. Thus, it is possible to provide an optimum layout design for the placement of cells while considering the wiring rate and the like as well as the random error (that is, the critical area value). As a result, the yield of LSIs can be intentionally improved. It is possible to reduce the random error on the basis of the layout design.

The present invention provides a layout program to realize a layout method for laying out an integrated circuit. The program causes a computer to execute placing a plurality of cells at approximate positions according to circuit data, and placing the plurality of cells at specific positions according to a result of the placing of the plurality of cells at the approximate positions. In the placing of the plurality of cells at the specific positions, the program further causes the computer to execute placing the plurality of cells at the specific positions, determining critical area values between cells of the plurality of cells adjacent to one another, and modifying the specific positions of the plurality of cells so as to reduce the critical area values determined.

The layout program recording medium of the present invention records a layout program such as the one previously described, on a computer readable recording medium.

According to a layout program and its recording medium of the present invention, the layout program is provided by being stored in various computer readable recording media such as a flexible disk, a CD-ROM, a CDR/W, and a DVD. This enables the layout method and apparatus of the present invention to be realized on a computer.

BRIEF DESCRIPTION OF THE DRAWINGS

FIG. 16 is a diagram illustrating the layout process. Specifically.

FIG. 17 is a diagram illustrating the layout process. Specifically, FIGS. 17A and 17B show an example of a critical area value table.

FIG. 18 is a diagram illustrating the layout process. Specifically.

FIG. 19 is a diagram illustrating the layout process. Specifically.

FIG. 20 is a diagram illustrating the layout process. Specifically.

DETAILED DESCRIPTION OF THE PREFERRED EMBODIMENTS

Figure 1:
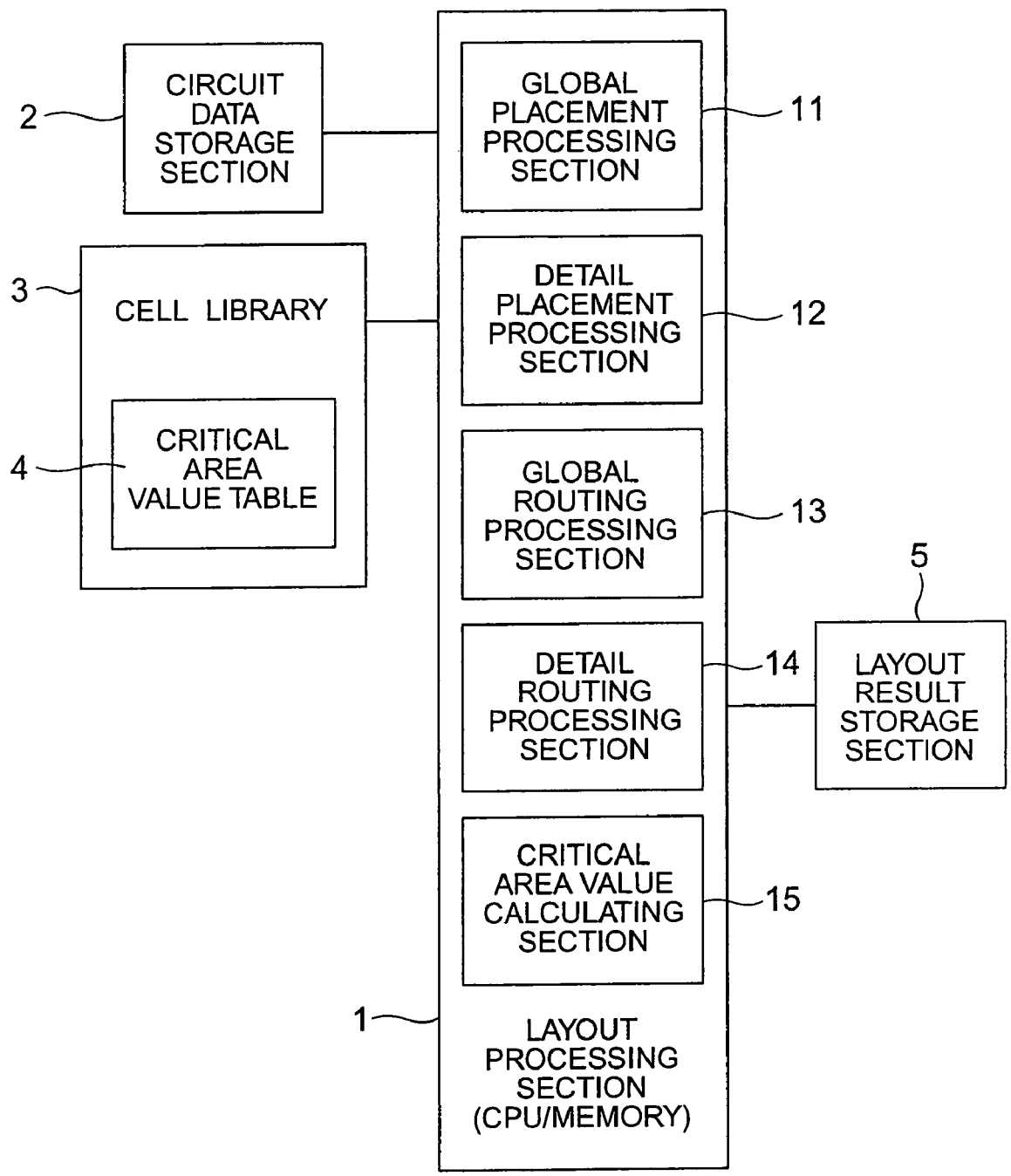
FIG. 1 is a diagram of the configuration of a layout apparatus, schematically showing the configuration of a layout apparatus that executes a layout method according to the present invention.

FIG. 1 is a diagram of the configuration of a layout apparatus, schematically showing the configuration of a layout apparatus that executes a layout method according to the present invention.

The layout apparatus comprises a layout processing section 1, a circuit data storage section 2, a cell library 3, a critical area value table 4, and a layout result storage section 5. In this example, the critical area value table 4 is provided in the cell library 3 as a part of it. However, the present invention is not limited to this. The layout processing section 1 comprises a global placement processing section 11, a detail placement processing section 12, a global routing processing section 13, a detail routing processing section 14, and a critical area value calculating section 15.

The circuit data storage section 2 stores, for example, circuit data obtained as a result of the design of an LSI circuit. The circuit data is not limited to those on LSIs but may be those on, for example, hybrid integrated circuits on ceramic wiring substrates or printed circuit boards. The layout processing section 1 reads circuit data from the circuit data storage section 2. The layout processing section 1 then lays out the circuit data and stores the result in the layout result storage section 5. In carrying out the layout, the layout processing section 1 references the cell library 3 and the critical area value table 4. The cell library 3 stores the pattern of an actual circuit of cells used in the circuit data. The critical area value table 4 stores the critical area values between adjacent cells.

The layout processing section 1 is realized by allowing a CPU (Central Processing Unit) of the layout apparatus to execute a layout program that executes the layout process. In this case, the layout program is present on a main memory. The layout program is provided by being stored in various computer readable recording media such as a flexible disk, a CD-ROM, a CDR/W, and a DVD. The circuit data storage section 2, the cell library 3, and the layout result storage section 5 are present on an auxiliary memory such as a disk apparatus and read onto the main memory as required.

The global placement processing section 11 reads circuit data from the circuit data storage section 2. The global placement processing section 11 executes a well-known global placement process to place a plurality of cells at approximate positions. The global placement processing section 11 sends the result of the placement (layout data) to the detail placement processing section 12.

According to the result of the placement of the plurality of cells at the approximate positions by the global placement processing section 11 (global placement), the detail placement processing section 12 places the plurality of cells at specific positions. That is, the positions (coordinates) of the cells on a chip are determined. Specifically, the detail placement processing section 12 executes a well-known detail placement process to place the plurality of cells at the specific positions. The detail placement processing section 12 determines the critical area values between the plurality of cells placed adjacent to one another by the detail placement process. The detail placement processing section 12 then modifies the specific positions of the plurality of cells so as to reduce the critical area values determined. The detail placement processing section 12 then sends the result of the placement after the modification (layout data) to the global routing processing section 13.

In this manner, the present invention uses the critical area value between adjacent cells as an index for allowing the random error to be considered in the cell placement in the layout design. The critical area value is an index indicating the likelihood of random errors and will be described later. Moreover, according to the present invention, the positions of the cells placed are modified so as to reduce the critical area values between the adjacent cells. This enables the critical area value, an index for random errors, to be reflected in the layout, particularly the placement of the cells. It is thus possible to reduce the critical area value for the whole LSI and the incidence of random errors, thus improving the yield.

The critical area value between the adjacent cells depends on the distance between the cells (actually, the pattern of circuit elements such as transistors or wires in the cell). Accordingly, in the detail placement process, which determines the distance, the critical area value is determined on the basis of the distance.

The detail placement processing section 12 actually references the critical area value table 4 to determine the critical area values between the plurality of cells adjacent to one another. To achieve this, the critical area value table 4 is provided in advance. The critical area value table 4 stores critical area values mathematically predetermined for a plurality of adjacent cells.

Further, the specific positions of the plurality of cells are modified by a replacement process, a rotation process, and a threshold process as described later in detail. In the replacement process, when the critical area value determined is reduced by replacing the positions of the two cells with each other, the replacement is carried out. In the rotation process, the critical area value determined is reduced by rotating the cell, the rotation is carried out. In the threshold process, when the critical area value determined is larger than a predetermined one, the specific positions of the plurality of cells are modified by inserting a gap (space) between the adjacent cells.

The global routing processing section 13 reads circuit data from the circuit data storage section 2. The global routing processing section 13 places the wires between the plurality of cells at approximate positions according to the circuit data and the result of the detail placement of the plurality of cells carried out by the detail placement processing section 12. Specifically, the global routing processing section 13 executes a well-known global routing process to place the wires at approximate positions. The global routing processing section 13 then determines the congestion level of the wires placed by this process. The global routing processing section 13 then modifies the approximate positions of the wires so as to reduce the congestion level of the wires determined. The global routing processing section 13 then sends the result of the placement (layout data) to the detail routing processing section 14.

The detail routing processing section 14 places the wires at specific positions according to the result of the global routing of the wires carried out by the global routing processing section 13. The detail routing processing section 14 then stores the layout result completed in the layout result storage section 5 as the result of the process by the layout processing section 1. Specifically, the detail routing processing section 14 executes a well-known detail routing process to place the wires at specific positions. The detail routing processing section 14 then mathematically determines the critical area values between the wires placed adjacent to one another by this process. When the critical area value determined is larger than a predetermined value and a wiring free space is present near the position, the free space is inserted between the wires placed adjacent to each other.

In this manner, the present invention uses the critical area value between adjacent wires as an index for considering random errors in the placement of the wires in the layout design. Moreover, according to the present invention, the positions of the wires once placed are modified so that the critical area values between the adjacent wires become smaller than a predetermined value. This enables the critical area value, an index for random errors, to be reflected in the layout, particularly in the placement of the wires. It is thus possible to reduce the critical area value for the whole LSI and the incidence of random errors, thus improving the yield of manufacturing.

The critical area value between the adjacent wires depends on the distance between the wires. Accordingly, in the detail routing process, which determines the distance, the critical area value is determined on the basis of the distance.

The detail routing processing section 14 actually determines the critical area value by requesting the critical area value calculating section 15 to calculate of the critical area value between adjacent wires. The critical area value calculating section 15 executes a predetermined calculating process to determine the critical area value. The critical area value calculating section 15 passes the critical area value determined to the detail routing processing section 14.

Further, when the above free space has been inserted, the detail routing processing section 14 checks whether or not the insertion may result in a new timing error, as required. When the error may occur, the detail routing processing section 14 deletes the free space inserted to return the specific positions of the adjacent wires to those prior to the insertion.

Figure 2:
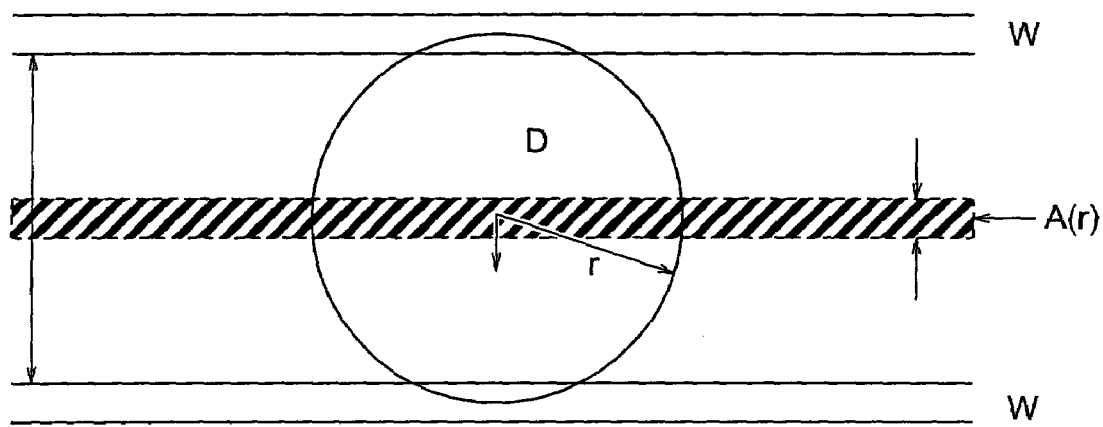
FIG. 2 is a diagram illustrating a critical area value.

The critical area value will be described with reference to FIG. 2. The critical area value is determined as described below. As shown in FIG. 2, a defect D is assumed to be a circle with a radius r. When the fall of center of the defect D (defect center) on a point on a chip shorts or opens two wires W (this will hereinafter simply be referred to as shorting), an area comprising the point on the chip is defined as A(r). The area A(r) is an index for the frequency of short errors caused by the defect D with the radius r. That is, the frequency of the error increases or decreases consistently with the area A(r). A distribution probability density of the defect D with the radius r is assumed to be D(r). In this case, an amount AC (absolute number) obtained by integrating the short area A(r) for the defect radius r by a distribution probability density D(r) is called a critical area or a critical area value. The amount AC is determined as shown below.

$$AC = \int A(r)D(r)dr \text{ (} \int \text{ ranges from "0" to "}\infty\text{")}$$

The critical area value AC represents an average short area for the defect D on the chip. Accordingly, the critical area value AC is an amount serving as an index for random errors in (or the yield of) the given chip. Methods for calculating the critical area value AC include various well-known ones such as a Monte Carlo method, a grid method, and a Voronoi diagram method. The critical area value AC has been considered to be the average short area for the defect D on the chip and to serve as an index for a short error frequency and thus for random errors as described later. However, it is based on the knowledge of the present invention to use the critical area value as an index for considering the random error in the placement of cells and wires in the layout design.

The critical area value AC is used in the detail placement process and detail routing process as previously described. However, the former process relates to the placement of cells and the critical area value AC is previously provided before a layout process. The latter process relates to the placement of wires and requires calculations of the critical area value AC during the layout process. The applications of the critical area value AC differ for each process. Therefore different calculating methods are desirably used for the processes as described below.

In the detail placement process, the detail placement processing section 12 references the critical area value table 4 previously provided to determine the critical area value AC for adjacent cells. That is, the critical area value table 4 can be prepared and the preparation of the critical area value table 4 requires only one calculation. Consequently, the length of the time required for calculations does not particularly matter. On the other hand, the critical area value AC for the cells depends on the pattern shape inside the cell (for example, the placement or shape of transistors). This requires detailed calculations. Thus, the Monte Carlo method, which is suitable for detailed calculations, is used as a method for determining the critical area value AC. The critical area values AC stored in the critical area value table 4 are the critical area values AC for cells of a known shape determined by the Monte Carlo method.

In the detail routing process, the detail routing processing section 14 determines the critical area value AC for adjacent wires by requesting the critical area value calculating section 15 to execute calculations. Thus, during the layout process, the critical area value AC must be repeatedly calculated for the individual wires. Accordingly, the calculation time is the greatest problem. The Monte Carlo method, the grid method, the Voronoi diagram method, or the like may be used but requires a long time in this case. Thus, the critical area value AC is desirably calculated using the following method.

The Monte Carlo method or the like requires a long calculation time because it uses a technique involving a high universality in terms of shape. Thus, attention is paid to the fact that the wiring is often shaped so that elongated rectangles are placed parallel to one another in a wiring direction. The nature of this wiring shape is utilized to relatively simply calculate the critical area value AC at high speed. Specifically, wiring data is scanned in a predetermined direction to detect an area in which three parallel lines are present on the result of the scan. The critical area values AC are calculated only for the area detected.

According to this calculating method (hereinafter referred to as a parallel wiring method), the critical area value AC can be calculated in a short time by using a relatively simple algorithm to simply scan the wiring data without using a technique involving a high universality for wiring of an arbitrary shape. It is not an object to accurately calculate the critical area value AC but the critical area value AC is used as an index for the layout. Consequently, calculations based on the parallel wiring method are sufficient.

Figure 3:
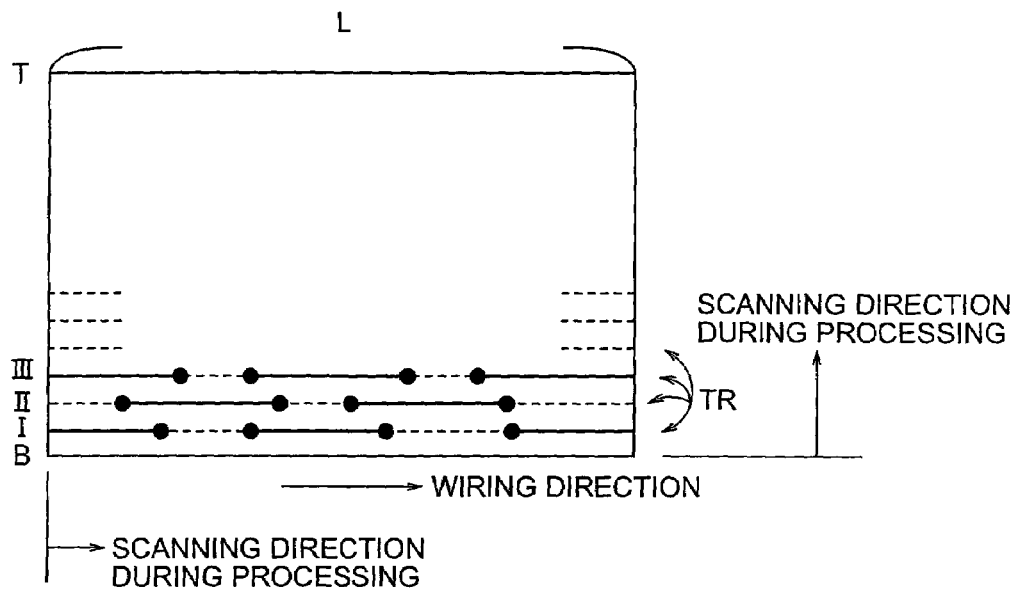
FIG. 3 is a diagram illustrating a critical area value.
Figure 4:
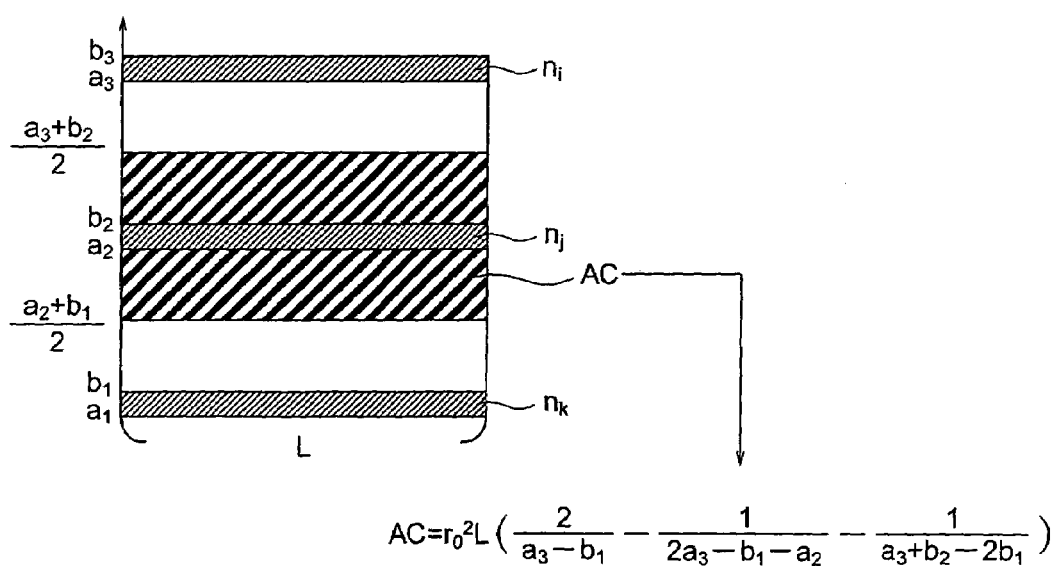
FIG. 4 is a diagram illustrating a critical area value.

FIG. 3 and FIG. 4 show the basic concept of calculation of the critical area value AC based on the parallel wiring method.

Description will be given of the wiring shape for which the calculation of the critical area value AC based on the parallel wiring method is intended. As shown in FIG. 3, on an LSI chip, wires are assumed to lie on the same area or parallel areas (tracks) in the wiring direction. In many LSIs with a high degree of integration, the wires between the cells may take such a shape. The tracks are numbered I, II, III, . . . from the bottom. The track has the maximum length L. Tracks of length L are present on a bottom side B and top side T of an LSI chip (or a wiring area to be processed; this will also applies to the following description). The wire is considered (assumed) to be formed all along the track. The direction of scanning during the calculation of the critical area value AC is defined, for example, as shown in FIG. 3. The tracks are scanned in order of B, I, II, III, . . . T and each track is scanned from the left end. The coordinates of a position at which the scan is started are defined as "0".

Further, in the calculation of the critical area value AC based on the parallel wiring method, the distribution probability density D(r) for the defect radius is expressed by the following equation (based on a rule of thumb).

$$D(r)=cr^q/r_0^{q+1}(\text{if } 0 \leq r \leq r_0)=cr_0^{p-1}/r^p(\text{if } r_0 \leq r)$$

In this equation, $c=(q+1)(p-1)/(p+q)$. Moreover, for simplification, $p=3$ and $q=1$ in the following description.

As shown in FIG. 4, the wiring data on the LSI contains three (laterally) parallel wires. In this case, a critical area value AC (shown with thick oblique lines in FIG. 4) can be easily calculated for an area including an intermediate (second) wire and bounded by a segment located at an equal distance from the first and second wires and a segment located at an equal distance from the second and third wires.

$$AC=r_0^2L(2/(a_3-b_1)-1/(2a_3-b_1-a_2)-1/(a_3+b_2-2b_1))$$

In this equation, as shown in FIG. 4, L denotes the length of the area, $a_1$ and $b_1$ denote the coordinates of the lower and upper ends of the lowermost wire $n_k$, $a_2$ and $b_2$ denote the coordinates of the lower and upper ends of the intermediate wire $n_j$, and $a_3$ and $b_3$ denote the coordinates of the lower and upper ends of the uppermost wire $n_i$.

The calculation of the critical area value AC based on the parallel wiring method is carried out by sequentially scanning the wiring data in the above scanning directions (horizontal and vertical directions, described later) to detect overlapping of wires (overlapping nodes) as shown in FIG. 4 and then sequentially approximately calculate the critical area value AC. For example, a large number of areas with wire overlapping as shown in FIG. 4 are also present in the wiring data shown in FIG. 3. These areas can be easily detected by checking the coordinates of the wires. The critical area values AC can also approximately calculated easily with the above mentioned equation. Basically, this enables the critical area value AC to be calculated by simply scanning the wiring (wiring data). As a result, high-speed calculations are possible.

Figure 5:
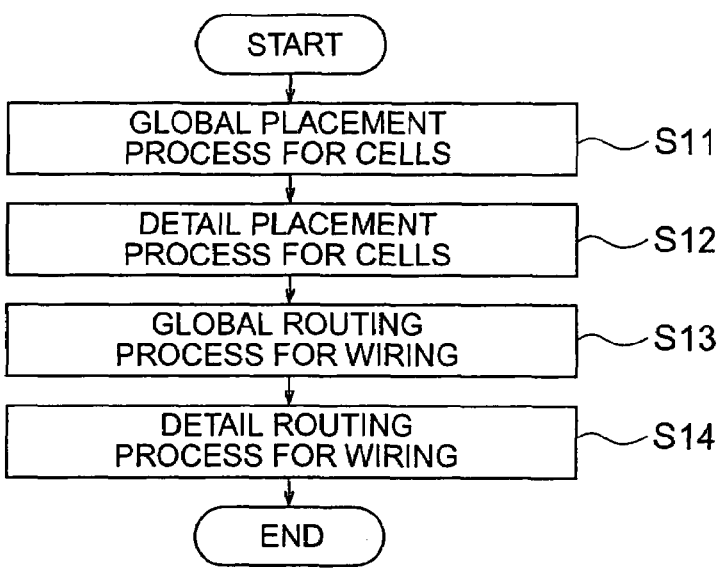
FIG. 5 is a flowchart of a layout process executed by the layout apparatus of the present invention.

FIG. 5 is a flowchart of a layout process executed by the layout apparatus of the present invention.

The global placement processing section 11 reads circuit data from the circuit data storage section 2. The global placement processing section 11 then uses cells from the cell library 3 to place a plurality of cells at approximate positions according to the circuit data as shown in the upper part of FIG. 12. That is, a global placement process is executed (step S11). This will be described later.

Figure 12:
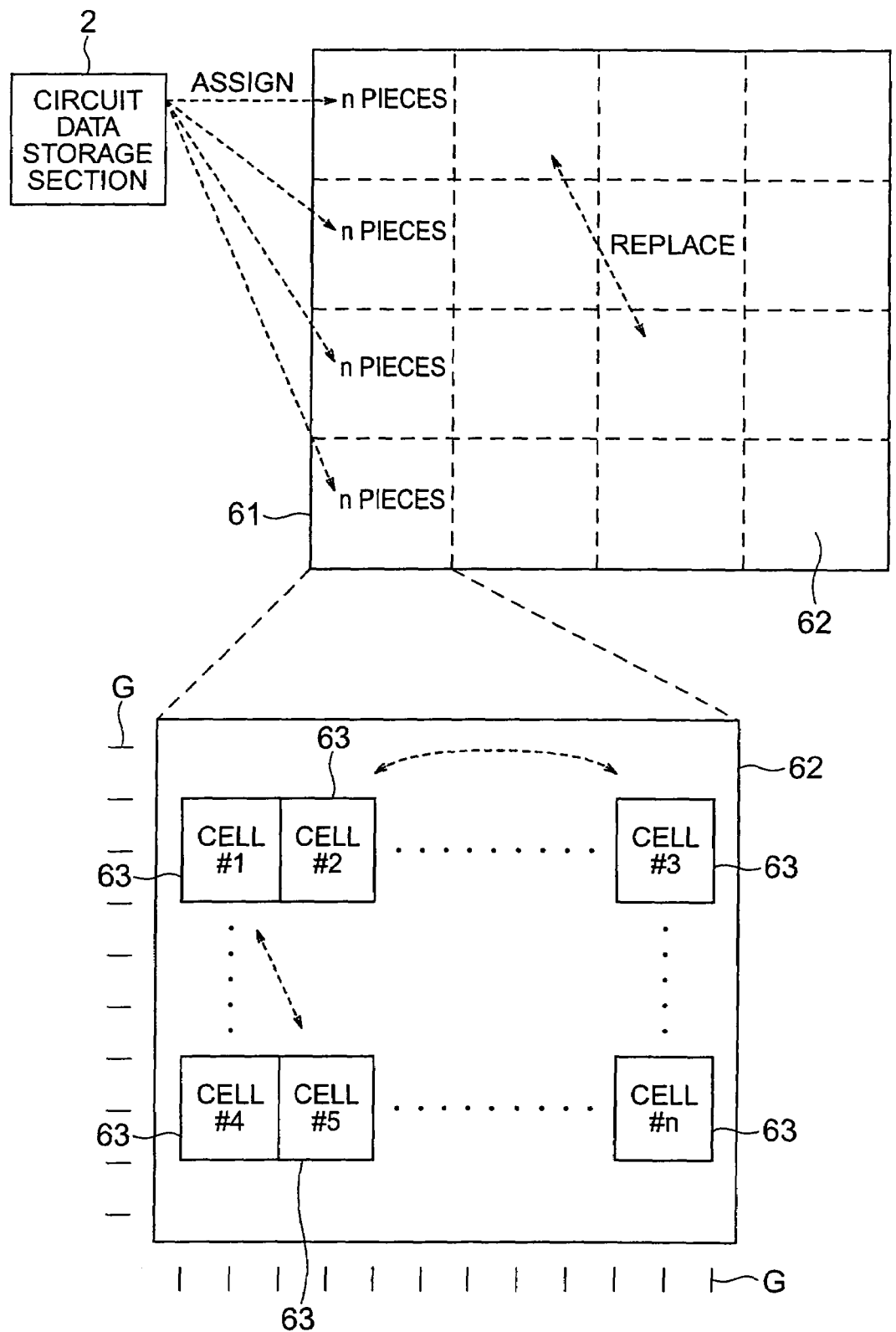
FIG. 12 is a diagram illustrating the layout process.

The detail placement processing section 12 then places the plurality of cells at specific positions according to the result of placement of the plurality of cells at the approximate positions by the global placement processing section 11 as shown in the lower part of FIG. 12. That is, a detail placement process is executed (step S12). This will be described later with reference to FIG. 6 through FIG. 8.

The global routing processing section 13 reads circuit data from the circuit data storage section 2. The global routing processing section 13 then places the wires 64 between a plurality of cells at approximate positions according to the circuit data and the result of placement of the plurality of cells at the specific positions by the detail placement processing section 12 as shown in the upper part of FIG. 13. That is, a global routing process is executed (step S13). This will be described later with reference to FIG. 9.

Figure 13:
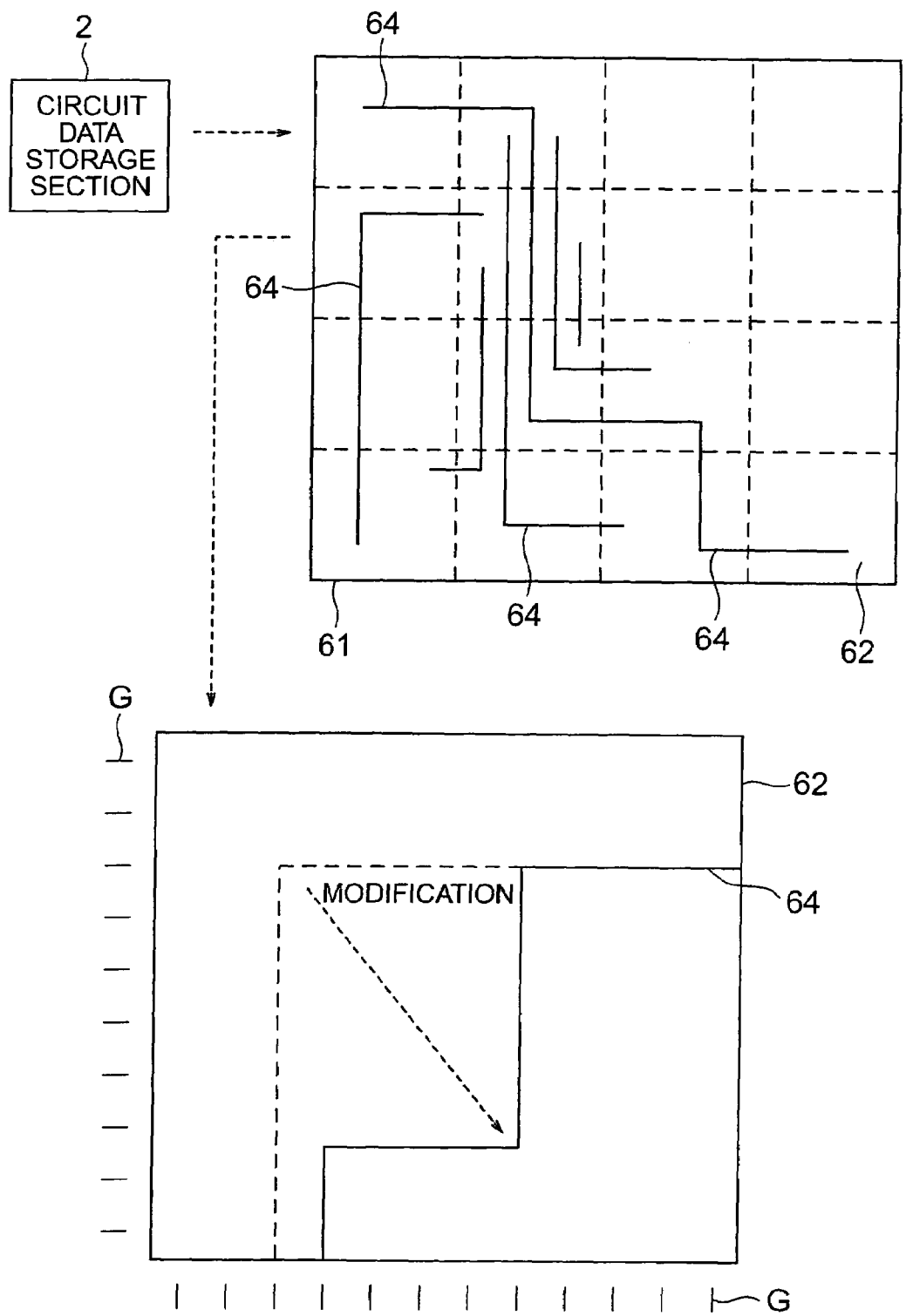
FIG. 13 is a diagram illustrating the layout process.

The detail routing processing section 14 then places the wires 64 at specific positions according to the result of placement of wires 64 at the approximate positions as shown in the lower part of FIG. 13. That is, a detail routing process is executed (step S14). This will be described later with reference to FIG. 10 and FIG. 11.

First, a detailed description will be given of the global placement process in step S11 in FIG. 5.

An example of a well-known global placement process by the global placement processing section 11 will be shown below. The global placement processing section 11 reads cells 63 from the circuit data in the circuit data storage section 2 in a predetermined order. The global placement processing section 11 then assigns n cells 63 to each global block 62 in a predetermined order as shown in the upper part of FIG. 12. The global block 62 is, for example, one of a plurality of rectangles (or squares) of an equal size into which a chip 61 is been virtually separated as shown by a dotted line. The number of global blocks 62 is not limited to the one shown in the FIG. 12. Every cell 63 is assigned to one of the global blocs 62 and placed at a free position in the global block 62. Subsequently, when the mutual replacement of the positions of cells 63 assigned to different global blocks 62 reduces costs such as a wiring length, the placement after the replacement is employed. When the mutual replacement does not reduce the cost, the placement before the replacement is employed. The costs are determined by approximate calculations because, for example, the wiring has not been defined yet. The layout of the cells 63 obtained is the result of the well-known global placement process.

Figure 14:
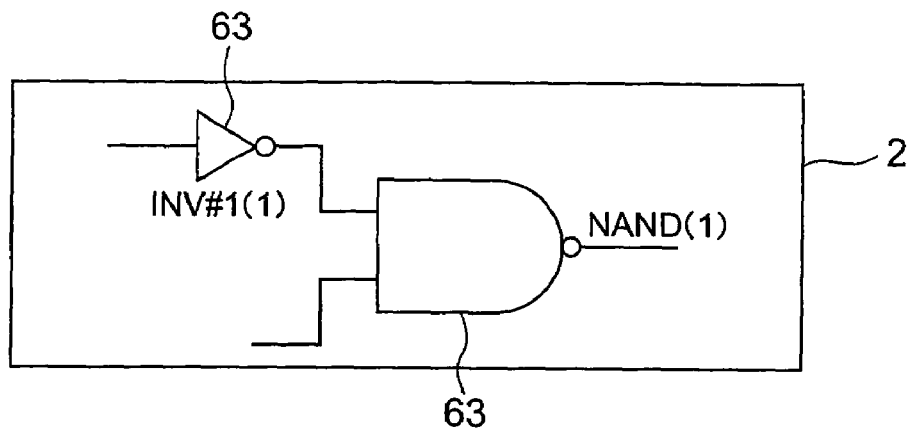
FIG. 14 is a diagram illustrating the layout process.

The circuit data storage section 2 stores, for example, circuit data obtained as a result of the design of an LSI circuit. The circuit data comprises the plurality of cells 63 such as inverters or NAND gate circuits as shown in FIG. 14 and wires 64 connecting the cells 63 together. Each cell 63 comprises, for example, a circuit symbol, a cell name (for example, INV#1), and the order of appearance of the cell 63 (for example, (1) indicates the first of the INV#1). The cell 63 is a unit circuit used in circuit design and layout design. Plural types of cells 63 that can be used in the circuit data are provided in the cell library 3 in advance.

Figure 15:
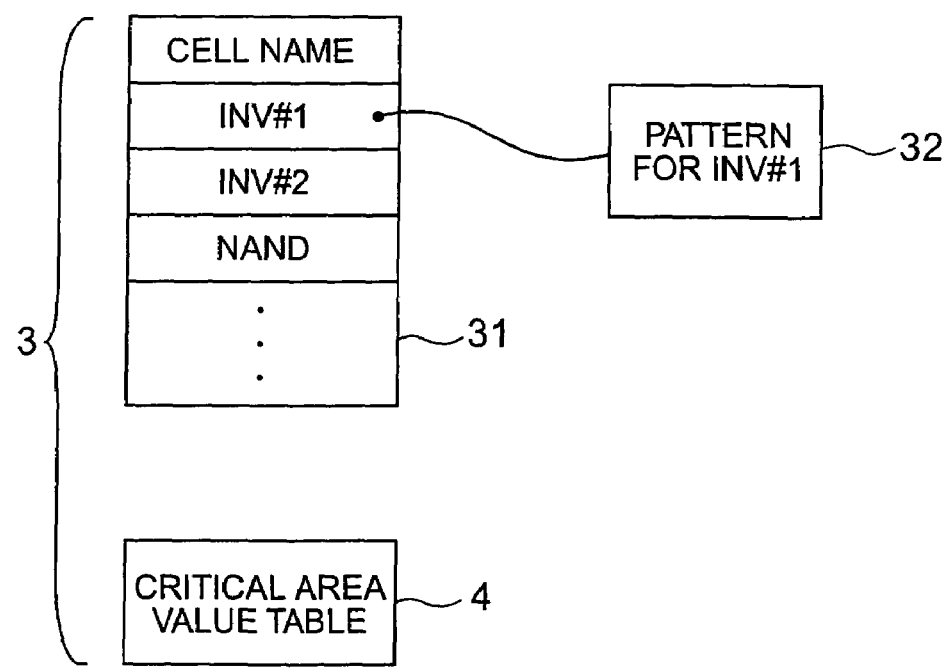
FIG. 15 is a diagram illustrating the layout process.

The cell library 3 stores an actual layout pattern for each type of cells 63, that is, unit circuits used in the circuit data. The cell library 3 comprises a list 31 of the cells 63 and the pattern 32 of the cells 63 and includes the critical area value table 4 as shown in FIG. 15. The list 31 stores cell names such as the INV#1. Each cell name points to the pattern 32. The pattern 32 is provided in association with each cell name and stores the actual layout pattern of the cells 63 (the pattern of transistors or the like, the pattern of the wires in the cells 63). The INV#1, INV#2, and NAND indicate the cells 63 of an inversion circuit #1, an inversion circuit #2, and a NAND gate circuit, respectively.

The cells 63 are not limited to these examples. For example, the cells 63 include circuits such as half adders, flip-flops, and selectors. For example, a full adder, a shift register, a multiplying circuit, or the like is a macro larger than the cell 63 and is composed of a combination of a plurality of cells 63.

Figure 16A:
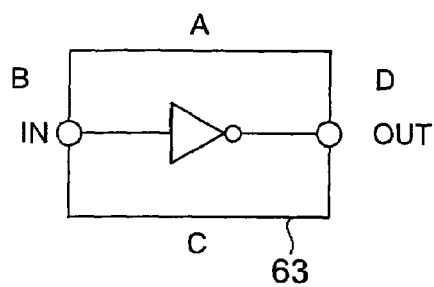
FIGS. 16A and 16B show a cell.
Figure 16B:
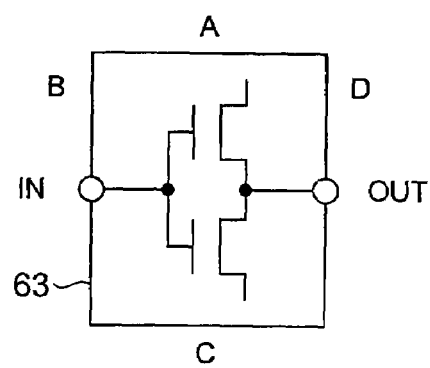
Figure 16C:
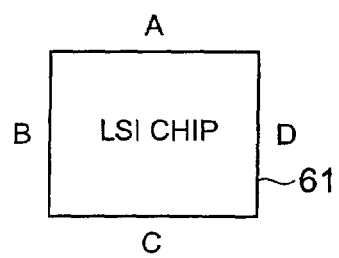
FIG. 16C shows a chip.
Figure 16D:
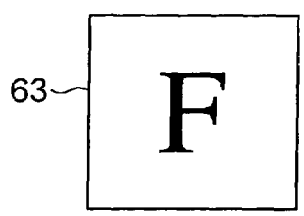
FIG. 16D through FIG. 16F show the relationship among cells.
Figure 16E:
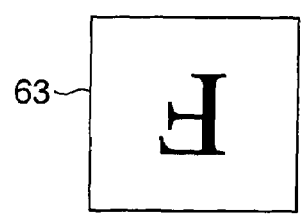

Further, the cell 63 has directivity. When the cell 63 lies in a direction such as the one shown in FIG. 16A, its internal layout pattern is as shown in FIG. 16B. For simplification, FIG. 16A and FIG. 16B show the simple cell 63. However, basically, the cell 63 is not symmetric in the vertical or horizontal direction. The illustration of a power source portion is omitted in FIG. 16B. The cell 63 is placed so that sides A, B, C, and D of the cell 63 shown in FIG. 16A correspond to sides A, B, C, and D of the LSI chip 61 shown in FIG. 16C, respectively. This determines the vertical and horizontal direction of the cell 63. Accordingly, when the normal (or basic) cell 63 shown in FIG. 16D is used as a reference, the cell 63 shown in FIG. 16E obtained by rotating the normal cell 63 through 180° and the cell 63 shown in FIG. 16F which is a mirror surface of the normal cell 63 exist. In FIG. 16D, the letter F in the cell 63 is provided for convenience in order to show the direction of the cell 63 (this also applies to the other figures).

Figure 7:
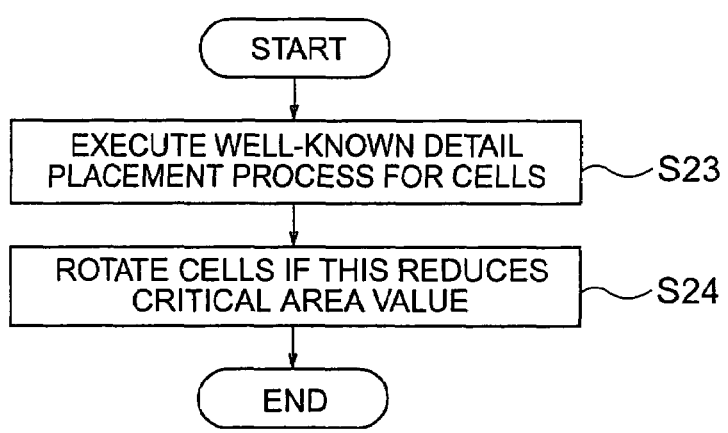
FIG. 7 is a flowchart of a layout process showing an example of a detail placement process.
Figure 8:
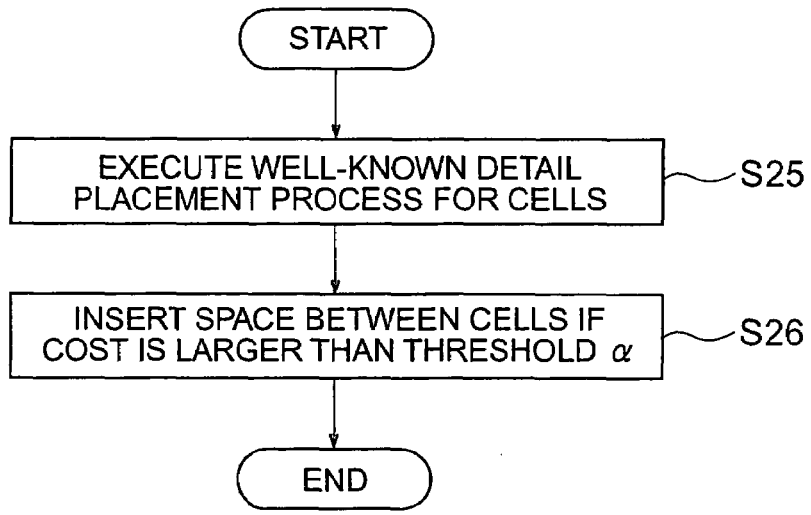
FIG. 8 is a flowchart of a layout process showing an example of a detail placement process.

Now, a detailed description will be given of the detail placement process in step S12 in FIG. 5. As previously described, in the detail placement process according to the present invention, at least one of the replacement, rotation, and threshold process for the cells 63 is executed after the well-known detail placement process in order to modify the positions of the cells 63. That is, one of the detail placement processes shown in one of FIG. 6, FIG. 7, and FIG. 8 is executed.

Figure 6:
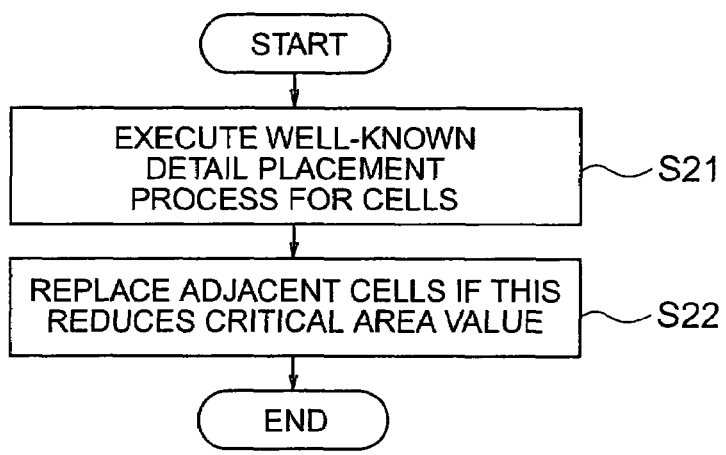
FIG. 6 is a flowchart of a layout process showing an example of a detail placement process.

FIG. 6 is a flowchart of a layout process showing an example of a detail placement process executed by the detail placement processing section 12 in step S12 in FIG. 5.

The detail placement processing section 12 uses the result of the global placement by the global placement processing section 11 to place a plurality of cells 63 at specific positions. That is, a well-known detail displacement process is executed (step S21).

An example of a well-known detail placement process by the detail placement processing section 12 will be shown below. On the basis of the result of the global placement, the detail placement processing section 12 places n cells 63 (#1 to #n) assigned to each global block 62, on grids G as shown in the lower part of FIG. 12. That is, each side of the cell 63 is located on the grid G. The grid G is a straight line virtually provided within the global block 62. A plurality of grids G are provided parallel to one another at uniform intervals in the vertical and horizontal directions. The intervals depend on the minimum processing size of the process. Each side of the cell 63 must be on the grid G (the cell 63 has such a size). In FIG. 12, the grid G is shown outside the global block 62 as a scale for the convenience of illustration. Subsequently, when the mutual replacement of the positions of the cells 63 within the same global block 62 reduces the costs such as the wiring length, the placement after the replacement is employed. When the mutual replacement does not reduce the costs, the placement before the replacement is employed. The costs are determined by approximate calculations because, for example, the wiring has not been defined yet. The resulting layout of the cell 63 is the result of the well-known detail placement process.

Figure 18A:
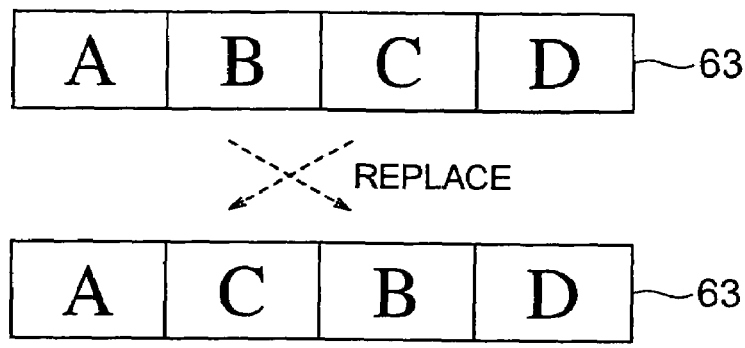
FIG. 18A through FIG. 18C show modifications in the positions of cells.

When the detail placement processing section 12 decides that the critical area value AC decreases after the replacement of the portion of the cells 63 shown in FIG. 18A by using the critical area value AC in the critical area value table 4, then the detail placement processing section 12 executes replacement on the cells 63 (step S22). This modifies the specific positions of the plurality of cells 63.

The detail placement processing section 12 uses the critical area value table 41 for the process of replacing the cells 63 with each other. As shown in FIG. 17A, the critical area value table 41 stores critical area values AC each obtained when each cell 63 (column cell) is laid out on the right side of a row cell. In other words, when the number of types of cells 63 is defined as C, critical area values AC in a case each cell is placed on the right side of another cell are calculated and stored for all the combinations C×C of the cells 63.

As previously described, the direction of the cell 63 is predefined. Accordingly, the expression "laying out a cell on the right side" means that the layout is carried out so that the side B of one cell 63 lies on the side D of another cell 63. The interior of the cell 63 is not always symmetric in the lateral direction as previously described. Accordingly, the critical area value AC (hereinafter also simply referred to as the value AC) for two cells 63 varies depending on which cell 63 is placed on the right side of another cell 63.

For example, as shown in FIG. 18A, it is assumed that in step S21, four cells A, B, C, and D are placed in this order. In this state, the position of the cell B is experimentally replaced with the position of the cell C. This modifies the value AC between the cell A and the cell B to the value AC between the cell A and the cell C. The value AC between the cell B and the cell C is modified to the value AC between the cell C and the cell B. The value AC between the cell C and the cell D is modified to the value AC between the cell B and the cell D. When the sum of the values AC after the modification is smaller than that before the modification, the position of the cell B is replaced with the position of the cell C. This reduces the value AC for the LSI as a whole and thus reduces the incidence of random errors.

FIG. 7 is a flowchart of a layout process showing an example of a detail placement process executed by the detail placement processing section 12 in step S12 in FIG. 5.

As in the case of step S21, the detail placement processing section 12 executes a well-known detail placement process to place a plurality of cells 63 at specific positions (step S23).

Figure 18B:
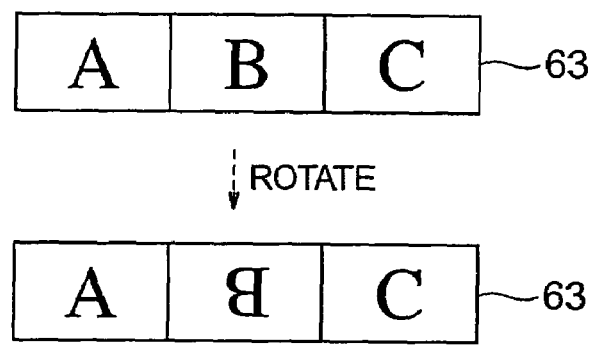

When the detail placement processing section 12 decides that the critical area value AC decreases after the rotation of the cells 63 shown in FIG. 18B by using the critical area value AC in the critical area value table 4, then the detail placement processing section 12 rotates the cell 63 (step S24). This modifies the specific positions of the plurality of cells 63.

The detail placement processing section 12 uses the critical area value table 42 for the process of rotating the cell 63. As shown in FIG. 17B, the critical area value table 42 stores critical area values AC each corresponding to a normal cell 63 (marked with N) and a cell 63 (marked with R) obtained by rotating the normal cell 63 through 180°, and each obtained when the cell 63 (column cell) is laid out on the right side of the row cell. In other words, when the number of types of cells 63 is defined as C, critical area values AC in a case each cell is placed on the right side of another cell are calculated and stored for all the combinations 2C×2C of the cells 63.

In most cases, a rotation angle of 180° may be considered for the rotation of the cell 63. However, cells 63 obtained by rotating the normal cell through 90° or 270° may be provided in the cell library 3 as required. In this case, a critical area value table 42 stores critical area values AC for all the combinations RC×RC of the cells 63. Here, R denotes the type of rotation and assumes a value of, for example, 1 to 4 (0°, 90°, 180°, and 270°). The critical area value table 41 shows the case of R=1 (only 0°), while the critical area value table 42 shows the case of R=2 (0° and 180°).

For example, as shown in FIG. 18B, it is assumed that in step S23, three cells A, B, and C are placed in this order. In this state, the cell B is experimentally rotated through 180°. This modifies the value AC between the cell A(N) and the cell B(N) to the value AC between the cell A(N) and the cell B(R). The value AC between the cell B(N) and the cell C(N) is modified to the value AC between the cell B(R) and the cell C(N). When the sum of the values AC after the modification is smaller than that before the modification, the cell B is rotated. This reduces the value AC for the LSI as a whole and thus reduces the incidence of random errors.

Figure 16F:
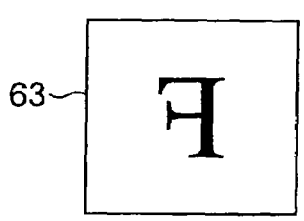

For the normal cell 63 shown in FIG. 16D, there is a cell 63 (marked with M) the internal pattern of which is a mirror surface of the normal cell 63 as shown in FIG. 16F. Cells 63 that are mirror surfaces of the corresponding normal cells 63 may be provided in the cell library 3 as required. In this case, the critical area value table 42 also stores values AC for the placements of the cells (M). Moreover, cells 63 obtained by rotating the cells (M) through various angles may be provided in the cell library 3, with the values AC stored in the critical area value table 42.

FIG. 8 is a flowchart of a layout process showing an example of a detail placement process executed by the detail placement processing section 12 in step S12 in FIG. 5.

As in the case of step S21, the detail placement processing section 12 executes a well-known detail placement process to place a plurality of cells 63 at specific positions (step S25).

Figure 18C:
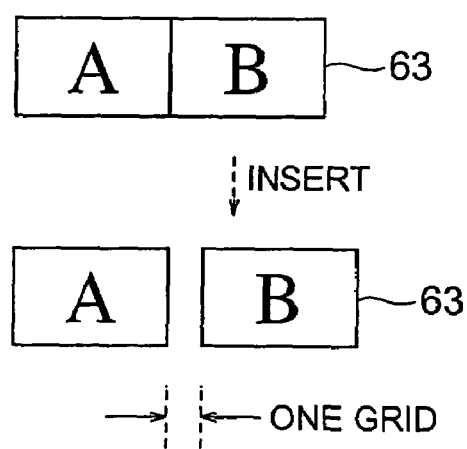

When the detail placement processing section 12 decides that the critical area value AC is larger than a threshold a by using the critical area value AC in the critical area value table 4, then the detail placement processing section 12 inserts a gap between the adjacent cells 63 as shown in FIG. 18C (step S26). This modifies the specific positions of the plurality of cells 63.

The detail placement processing section 12 uses the critical area value table 41 or 42 for the threshold process for the cell 63. For example, as shown in FIG. 18C, it is assumed that in step S25, two normal cells A and B are placed in this order. In this state, the detail placement processing section 12 references the critical area value table 41 to determine the value AC for the cells A and B. The detail placement processing section 12 then compares the value AC with the threshold $\alpha$. When the value AC is larger than the threshold $\alpha$, the detail placement processing section 12 inserts a gap for one grid between the cells A and B. The threshold $\alpha$ is empirically predefined. This also applies to rotated cells 63 and mirror cells 63. The above process reduces the value AC for the LSI as a whole and thus reduces the incidence of random errors.

The detail placement processing section 12 may execute all of the replacement, rotation, and threshold processes for the cells 63. For example, after step S21, steps S22, S24, and S26 may be sequentially executed. Alternatively, the order of steps S22, S24, and S26 may be replaced as required. Alternatively, two of the three processes may be selected for execution. When the critical area value table 42 is provided, the critical area value table 41 may be omitted.

Figure 9:
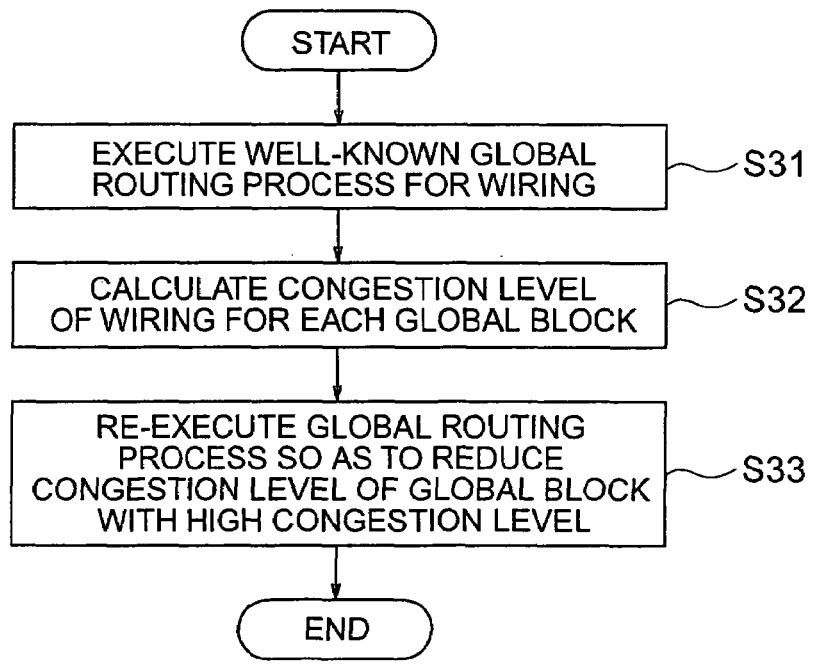
FIG. 9 is a flowchart of a layout process showing an example of a global routing process.

Now, a detailed description will be given of the global routing process in step S13 in FIG. 5. FIG. 9 is a flowchart of a layout process showing an example of a global routing process executed by the global routing processing section 13 in step S13 in FIG. 5.

The global routing processing section 13 reads circuit data from the circuit data storage section 2. The global routing processing section 13 then places the wires 64 at approximate positions according to the circuit data (step S31). An example of a well-known global routing process executed by the global routing processing section 13 will be shown below. The global routing processing section 13 reads the wires 64 from the circuit data in the circuit data storage section 2 in a predetermined order. The global routing processing section 13 then places the wires 64 among the global blocks 62 in which the cells 63 (not shown in FIG. 13) are placed; the wires 64 are connected to the cells 63. Every wire 64 is placed so as to pass through one or more global blocks 62. The resulting layout of the wires 64 is the result of the well-known global routing process.

The global routing processing section 13 executes a predetermined calculation to determine the congestion level K=n1/n2 of the wires 64 placed for each global block 62 (step S32). Here, n1 denotes the number of wires 64 actually placed in the global block 62. N2 denotes the maximum allowable number of wires 64 placed in the global block 62. Accordingly, n2 is, for example, the number of grids present in the global block 62.

Figure 19A:
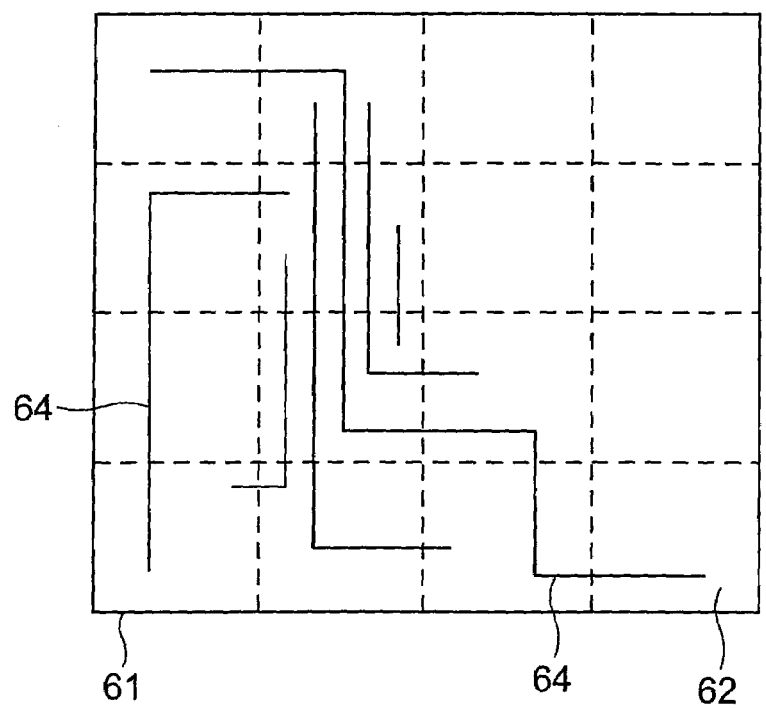
FIGS. 19A and 19B show modification in the positions of wires.
Figure 19B:
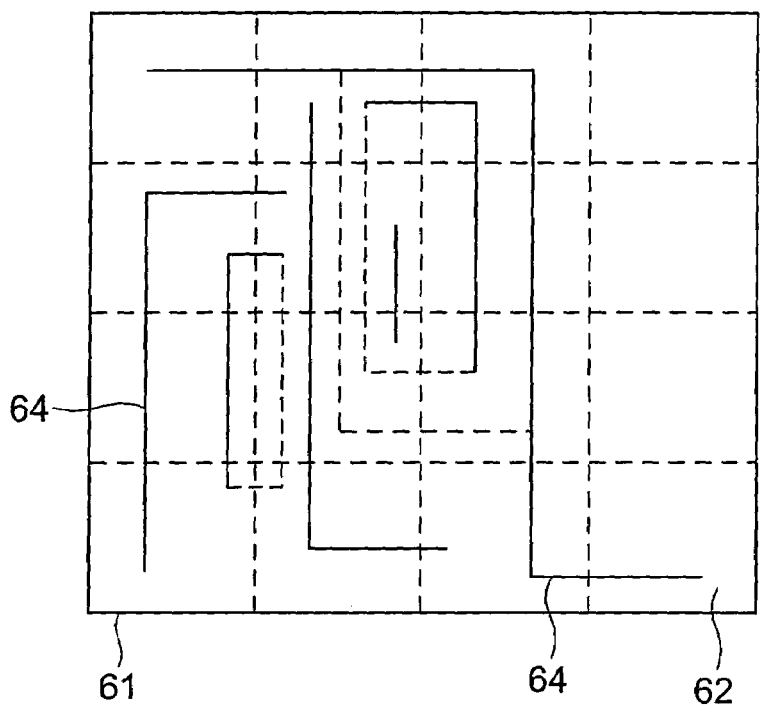

The global routing processing section 13 modifies the approximate positions of the wires 64 so as to reduce the congestion level of the wires 64 (step S33). In other words, the global routing processing section 13 executes a global routing process again so as to make the congestion levels of the global blocks 62 uniform. This serves to eliminate areas with an extremely large critical area value AC. For example, in FIG. 19A, global blocks 62 in which the wires 64 have a high congestion level and global blocks 62 in which the wires 64 have a low congestion level are determined. In this case, for the wires 64 in the vertical direction, high congestion levels are observed in the global blocks 62 in the first row and second column, in the second row and second column, in the third row and second column, and in the fourth row and second column (these global blocks will hereinafter be referred to as GB(1, 2), GB(2, 2), GB(3, 2), and GB(4, 2), respectively). Thus, the global routing processing section 13 moves the wires 64 (modifies the positions of the wires 64) as shown in FIG. 19B. Specifically, one wire 64 is moved to the global blocks GB(2, 1) and (3, 1) with low congestion levels. Two wires 64 are moved to the global blocks GB(1, 3), GB(2, 3) and (3, 3) with low congestion levels. In FIG. 19B, the wires 64 before the movement are shown by dotted lines, while the wires 64 after the movement are shown by solid lines. The wires 64 not paired with dotted lines (only solid lines) have not been moved. This operation makes the congestion level of the wires 64 in the vertical direction (the congestion level of the target global block 62) uniform (the number of actual wires is larger). For the wires 64 in the lateral direction, the congestion levels are made uniform.

A well-known process for optimizing the congestion levels of the wires 64 may be executed before the process for making the congestion levels of the wires 64 uniform (step S33). However, in this case, the congestion levels of the wires 64 may not be made uniform. As a result, there remain areas with relatively large critical area values AC. Therefore, it is desirable to execute a preprocess for using a uniformalizing process to optimize the critical area values AC.

Figure 10:
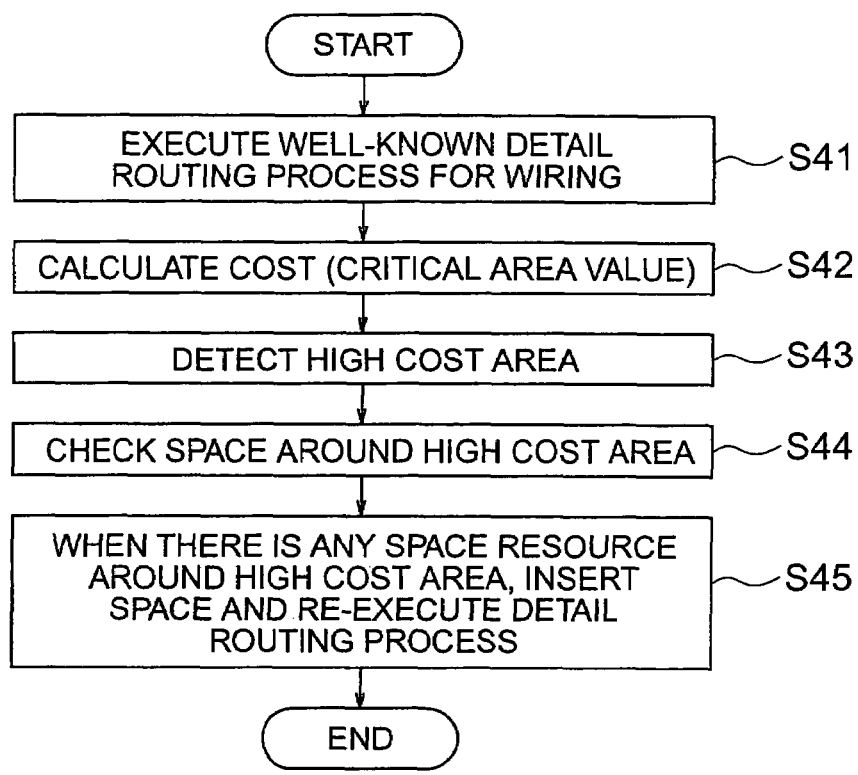
FIG. 10 is a flowchart of a layout process showing an example of a detail routing process.

Now, a detailed description will be given of the detail routing process in step S14 in FIG. 5. FIG. 10 is a flowchart of a layout process showing an example of a detail routing process executed by the detail routing processing section 14 in step S14 in FIG. 5.

The detail routing processing section 14 uses the result of the global routing by the global routing processing section 13 to place the wires 64 at specific positions (step S41). An example of a well-known detail routing process by the detail routing processing section 14 will be shown below. On the basis of the result of the global routing, the detail routing processing section 14 places wires 64 reaching or passing through each global block 62, on grids G as shown in the lower part of FIG. 13. Each wires 64 is laid on the grid G. The wire 64 must be on the grid G. Subsequently, when a modification in the position of each of wires 64 within the same global block 62 reduces the costs such as the wiring length, the placement after modification is employed as shown in the lower part of FIG. 13. When the modification does not reduce the costs, the placement before the modification is employed. In the lower part of FIG. 13, the wire 64 before the modification is shown by a dotted line, while the wire 64 after the modification is shown by a solid line. The resulting layout of the cells 63 is the result of the well-known global routing process.

The detail routing processing section 14 requests the critical area value calculating section 15 to determine critical area values AC for the wires 64 placed adjacent to one another as a result of the detail routing process (step S42). As previously described, in response to the request from the detail routing processing section 14, the critical area value calculating section 15 uses the parallel wiring method instead of the Monte Carlo method or the like to mathematically determine critical area values AC for the adjacent wires 64. The detail routing processing section 14 then returns the results to the detail routing processing section 14.

That is, the critical area value calculating section 15 receives the result of the detail routing process (that is, wiring data) together with the request. The wiring data is a combination of the wires 64 in the vertical and horizontal directions as shown in FIG. 3. Then, the critical area value calculating section 15 scans the wiring data in the above predetermined direction. On the basis of the result of the scan, the critical area value calculating section 15 detects areas in which three wires 64 are placed parallel to one another at uniform intervals as shown in FIG. 15. The area can be easily detected by checking the coordinates of the wires 64. There are many types of algorithms to detect the areas. Since each wire 64 extends in two directions, the scan and detection are also carried out in the two directions. Then, the critical area value calculating section 15 uses the above equation to sequentially calculate the critical area value AC for each area detected. Thus, the critical area value AC can be calculated at high speed by simply scanning the wiring data in the two directions.

Figure 20A:
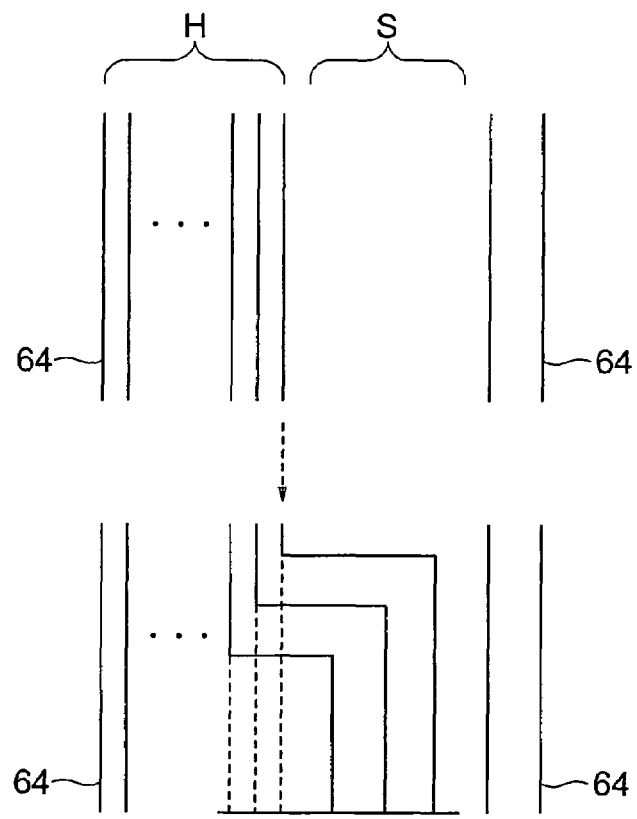
FIG. 20A shows modification in the positions of wires.

The detail routing processing section 14 searches for an area in which the critical area value AC determined by the critical area value calculating section 15 is larger than the predetermined one (high cost area H) (step S43). In other words, the detail routing processing section 14 determines an area for which the critical area value AC as a cost should be improved. The predetermined value is empirically predefined. For example, the high cost area H may be present within one global block 62 as shown in FIG. 20A.

The detail routing processing section 14 checks whether or not there is any free space S around and adjacent to the high cost area (step S44). The critical area value AC for the free space S is zero (that is, an unwired area having no wires 64) or closer to zero. For example, the free space S may be present within one global block 62 as shown in FIG. 20A.

When there is any free space S, the detail routing processing section 14 executes a rewiring process by inserting a space between the adjacent wires 64 in the high cost area H (step S45). In FIG. 20A, the high cost area H and the adjacent free space are integrated into a new area H'. Spaces each corresponding to one grid are inserted between the wires 64 present in the area H' to reduce the critical area value AC. For example, spaces each corresponding to one grid are sequentially inserted between the wires 64 in the high cost area H starting with the wires 64 closest to the free space S. When the number of grids is smaller than that of wires 64 in the high cost area H, it is impossible to insert a space between all the paired wires 64 in the high cost area H. However, even in this case, the critical area value AC for the whole LSI is reduced. The resulting layout of the wires 64 is the final result of the global routing process. When there is no free space S, the rewiring process (step S45) is not executed.

Figure 11:
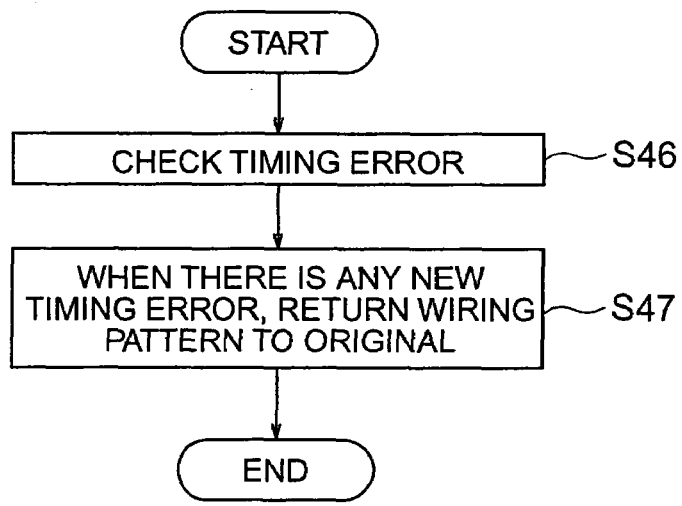
FIG. 11 is a flowchart of a layout process showing an example of a detail routing process.

FIG. 11 is a flowchart of the layout process showing another example of a detail routing process executed by the detail routing processing section 14 in step S14 in FIG. 5. Step S45 of the process shown in FIG. 10 is followed by the process shown in FIG. 11 without a break.

Figure 20B:
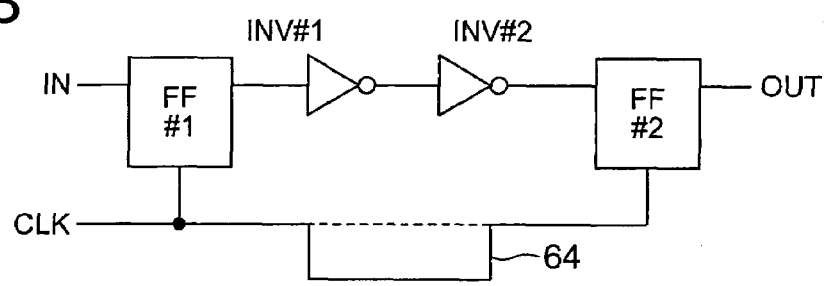
FIGS. 20B and 20C show variation in timing resulting from the modification in the positions of the wires.
Figure 20C:
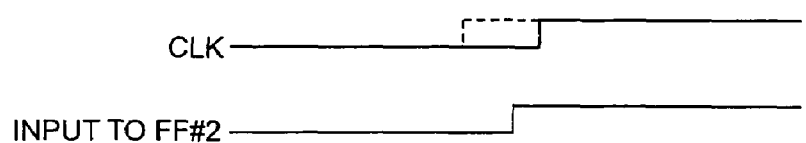

After step S45, the detail routing processing section 14 recalculates timings to check whether or not a timing error may result from the insertion of spaces in step S45 (step S46). As a result of the insertion of the free space, the length of each of the wires 64 relocated increases by, for example, double the space inserted (that is, the number of grids), as can be seen in FIG. 20A. This increases the resistance R and parasitic capacitance C of the wire 64 and thus increases its time constant. Consequently, a delay in a signal propagating through the wire 64 increases. For example, the wire 64 is assumed to supply a clock signal CLK to flip-flop circuits FF#1 and FF#2 as shown in FIG. 20B. When the wire 64 is relocated as previously described, then the clock signal CLK is delayed as shown in FIG. 20C. That is, the wire 64 is shifted from a straight line form shown by a dotted line in FIG. 20A and FIG. 20B to a detour form shown by a solid line in the same figures. Accordingly, the timing for the clock signal CLK shown by a dotted line in FIG. 20C is delayed to the one shown by a solid line in the same figure. Thus, the clock signal CLK is input to the flip-flop circuit FF#2 after an input signal; the clock signal CLK is otherwise input to the flip-flop circuit FF#2 before the input signal. This results in a timing error.

When a timing error may occur, the detail routing processing section 14 deletes the free space inserted to return the specific position of the adjacent wire 64 to the one prior to the insertion (step S47). This prevents the timings from being degraded, while reducing the incidence of random errors. In this case, the high cost area H detected in step S43 remains. Thus actually, in step S47, the area 64 which may result in a timing error may be returned to the state prior to the insertion. Then, a space may be inserted between other wires 64 in the high cost area so as not to cause any trouble.

As described above, the layout method according to the present invention places the cells shown in circuit data at specific positions on the basis of the critical area value. This enables random errors to be considered in placing the cells in the layout design of an LSI. The optimum layout design can be provided in placing the cells while considering the random error, a cost, in addition to the costs such as the wiring rate. As a result, the yield of LSIs can be intentionally improved, thus greatly contributing to the semiconductor business. As manufacturing processes of LSIs become finer, the yield depends more heavily on random errors. Consequently, the layout design can be used to sharply reduce the random error.

The layout method according to the present invention places the wires shown in circuit data at specific positions on the basis of the critical area value. This further enables the wiring rate and the like as well as the random error to be considered in placing the wires in the layout design of the LSI. Accordingly, the optimum layout design can be provided in placing the wires. As a result, the yield of LSIs can be intentionally improved, and the layout design can be used to sharply reduce the random error.

The layout apparatus according to the present invention places the cells shown in circuit data at specific positions on the basis of the critical area value. The optimum layout design can be provided in placing the cells while considering the wiring rate and the like as well as the random error. As a result, the yield of LSIs can be intentionally improved, and the layout design can be used to sharply reduce the random error.

The present invention also provides a layout program and a recording medium in which the layout program is provided by being stored in various computer readable recording media such as a CD-ROM, a CDR/W, and a DVD. This enables the layout method and apparatus according to the present invention to be realized on a computer.

What is claimed is:

1. A layout method for a layout apparatus for laying out an integrated circuit, the method comprising:
    placing a plurality of cells at approximate positions according to circuit data; and
    placing the plurality of cells at specific positions according to a result of the placing of the plurality of cells at the approximate positions,
    wherein the placing of the plurality of cells at the specific positions further comprises:
    placing the plurality of cells at the specific positions;
    determining critical area values between two cells adjacent to one another in the plurality of cells, the two cells including two wires parallel and adjacent with each other, one of the two wires being included in one of the two cells and the other of the two wires being included in the other of the two cells, each of the critical area values being obtained by integrating a short area by a distribution probability density of a defect, the defect being a circle with a radius, the short area being an area gathering a point on which a center of a defect is positioned when the defect shorts or opens the two wires; and
    modifying the specific positions of the plurality of cells so as to reduce the critical area values determined, and
    wherein, in a case that the critical area values determined are reduced by replacing a position of first cell and a position of second cell with one another, the specific positions of the plurality of cells are modified by the replacing of the first cell and the second cell with one another.

2. The layout method according to claim 1, wherein, in a case that the critical area values determined are reduced by rotating cell, the specific positions of the plurality of cells are modified by the rotating of the cell.

3. The layout method according to claim 1, wherein, in a case that the critical area value determined between adjacent cells is larger than a predetermined value, the specific positions of the plurality of cells are modified by inserting a gap between the adjacent cells.

4. The layout method according to claim 1, further comprising:
    providing a critical area value table which stores critical area values in a case that each of a plurality of cells of different types is placed on a right side of another cell for all combination of the plurality of cells of different types,
    wherein the critical area value table is referenced to determine the critical area values between two cells adjacent to one another according to two types of the two cells.

5. The layout method according to claim 1, further comprising:
   placing wires between the plurality of cells at approximate positions according to the circuit data and the result of the placing of the plurality of cells at the specific positions; and
   placing the wires at specific positions according to a result of the placing of the wires at the approximate positions,
   wherein the placing of the wires at the specific positions further comprises:
   placing the wires at the specific positions;
   mathematically determining critical area values between the adjacent wires; and
   inserting the free space between the adjacent wires in a case that the critical area value determined is larger than a predetermined value and that a wiring free space is present near the position.

6. The layout method according to claim 5, wherein the placing of the wires at the approximate positions further comprises deleting the inserted free space and returning the specific positions of the adjacent wires to the ones prior to the inserting in a case that the inserting of the free space results in a timing error.

7. The layout method according to claim 5, wherein the placing of the wires at the approximate positions further comprises:
   placing the wires at the approximate positions;
   determining a congestion level of the wires placed; and
   modifying the approximate positions of the wires so as to reduce the congestion level of the wires determined.

8. A layout apparatus for laying out an integrated circuit, the apparatus comprising:
   global placement placing a plurality of cells at approximate positions according to circuit data; and
   detail placement unit placing the plurality of cells at specific positions according to a result of the placement of the plurality of cells at the approximate positions,
   wherein the detail placement unit places the plurality of cells at the specific positions, determines critical area values between two cells adjacent to one another in the plurality of cells, the two cells including two wires parallel and adjacent with each other, one of the two wires being included in one of the two cells and the other of the two wires being included in the other of the two cells, each of the critical area values is obtained by integrating a short area by a distribution probability density of a defect, the defect being a circle with a radius, the short area is an area gathering a point on which a center of a defect is positioned when the defect shorts or opens the two wires, and modifies the specific positions of the plurality of cells so as to reduce the critical area values determined, and
   wherein, in a case that the critical area values determined are reduced by replacing a position of first cell and a position of second cell with one another, the specific positions of the plurality of cells are modified by the replacing of the first cell and the second cell with one another.

9. A computer readable recording medium recording a program to realize a layout method for laying out an integrated circuit, the program causing a computer to execute:
   placing a plurality of cells at approximate positions according to circuit data; and
   placing the plurality of cells at specific positions according to a result of the placing of the plurality of cells at the approximate positions,
   wherein, in the placing of the plurality of cells at the specific positions, the program further causes the computer to execute:
   placing the plurality of cells at specific positions;
   determining critical area values between two cells adjacent to one another in the plurality of cells, the two cells including two wires parallel and adjacent with each other, one of the two wires being included in one of the two cells and the other of the two wires being included in the other of the two cells, each of the critical area values being obtained by integrated a short area by a distribution probability density of a defect, the defect being a circle with a radius, the short area being an area gathering a point on which a center of a defect is positioned when the defect shorts or opens the two wires; and
   modifying the specific positions of the plurality of cells so as to reduce the critical area values determined, and
   wherein, in a case that the critical area values determined are reduced by replacing a position of first cell and a position of second cell with one another, the specific positions of the plurality of cells are modified by the replacing of the first cell and the second cell with one another.

* * * * *

UNITED STATES PATENT AND TRADEMARK OFFICE
CERTIFICATE OF CORRECTION

PATENT NO. : 7,512,921 B2  Page 1 of 1
APPLICATION NO. : 11/019365
DATED : March 31, 2009
INVENTOR(S) : Toshiyuki Shibuya It is certified that error appears in the above-identified patent and that said Letters Patent is hereby corrected as shown below:

Title Page, Item (56), under "FOREIGN PATENT DOCUMENTS", Line 3, change "11-85719" to --11-87519--.

Signed and Sealed this

Second Day of June, 2009

JOHN DOLL
*Acting Director of the United States Patent and Trademark Office*